United States Patent [19]

Ito et al.

[11] 4,206,410

[45] Jun. 3, 1980

[54] AUTOMATIC FREQUENCY CONTROL SYSTEM FOR SINGLE SIDEBAND SIGNAL RECEIVER

[75] Inventors: Hideo Ito, Sagamihara; Haruo Hiki, Tokyo, both of Japan

[73] Assignee: Sony Corporation, Tokyo, Japan

[21] Appl. No.: 887,362

[22] Filed: Mar. 16, 1978

[30] Foreign Application Priority Data

Mar. 19, 1977 [JP] Japan .................................. 52-29798
Mar. 19, 1977 [JP] Japan .................................. 52-29799

[51] Int. Cl.² .......................................... H04B 1/16
[52] U.S. Cl. ...................................... 455/203; 455/263
[58] Field of Search ............... 325/329, 330, 418, 420, 325/421, 422, 423, 17, 50

[56] References Cited

U.S. PATENT DOCUMENTS

| | | | |
|---|---|---|---|
| 2,932,730 | 4/1960 | Buff | 325/423 |
| 2,976,410 | 3/1961 | Schock | 325/423 |
| 3,003,117 | 10/1961 | Stavis | 325/423 |
| 3,091,740 | 5/1963 | Murphy, Jr. | 325/421 |
| 3,201,692 | 8/1965 | Sichak et al. | |
| 3,223,943 | 12/1965 | Dumaire et al. | 325/423 |
| 3,345,571 | 10/1967 | Selwyn | 325/329 |
| 3,649,919 | 3/1972 | Fridman et al. | 325/418 |
| 3,869,674 | 3/1975 | Borbely | 325/423 |
| 3,968,441 | 7/1976 | Garskamp | 325/420 |
| 3,969,675 | 7/1976 | Gosling | 325/330 |
| 3,980,968 | 9/1976 | Ma | 325/422 |
| 4,047,111 | 9/1977 | Barr | 325/421 |

*Primary Examiner*—Marc E. Bookbinder
*Attorney, Agent, or Firm*—Lewis H. Eslinger; Alvin Sinderbrand

[57] ABSTRACT

A single sideband receiver having a demodulator or mixer for carrier frequency demodulation in response to the output of a controllable variable frequency oscillator and an intermediate frequency demodulator for providing a demodulated signal is provided with an automatic frequency control system comprising a low pass filter for separating a low frequency portion from the demodulated signal a discriminator for detecting the level of the low frequency portion with respect to a predetermined level, and a circuit for controlling the frequency of the variable frequency oscillator in response to the detected relationship between the low frequency portion and the predetermined level.

12 Claims, 19 Drawing Figures

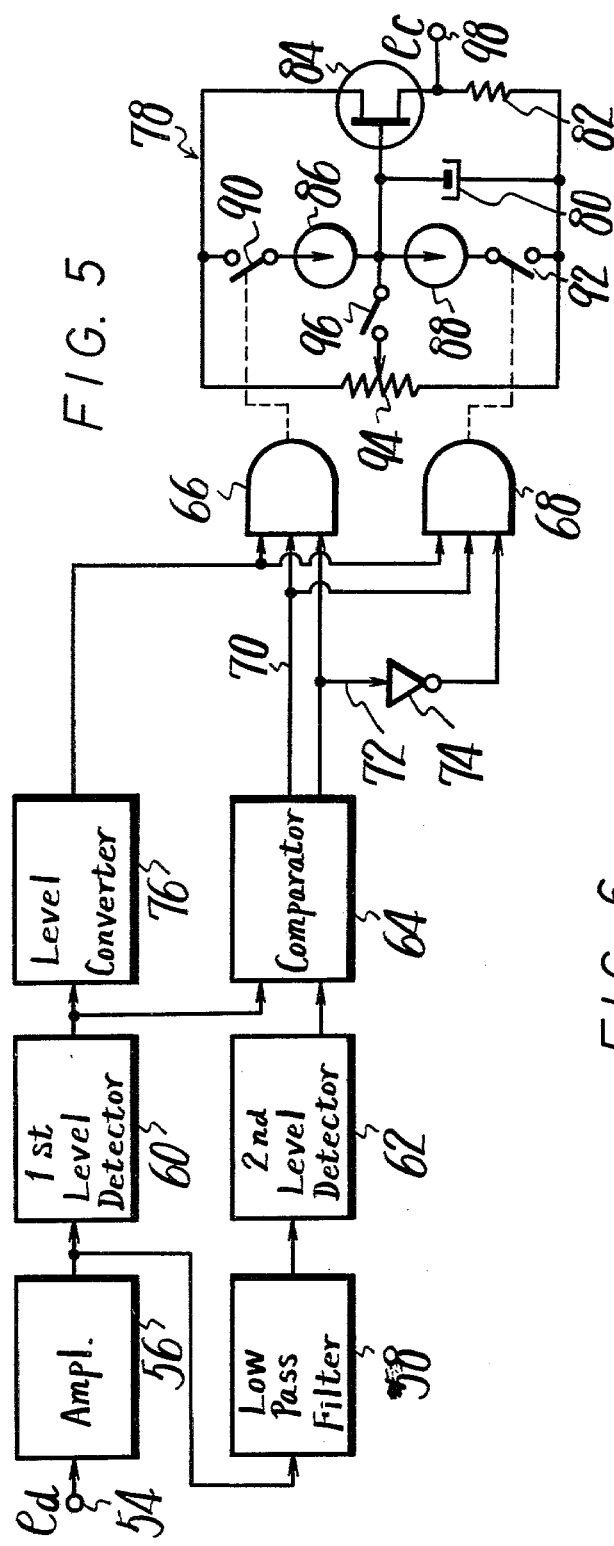
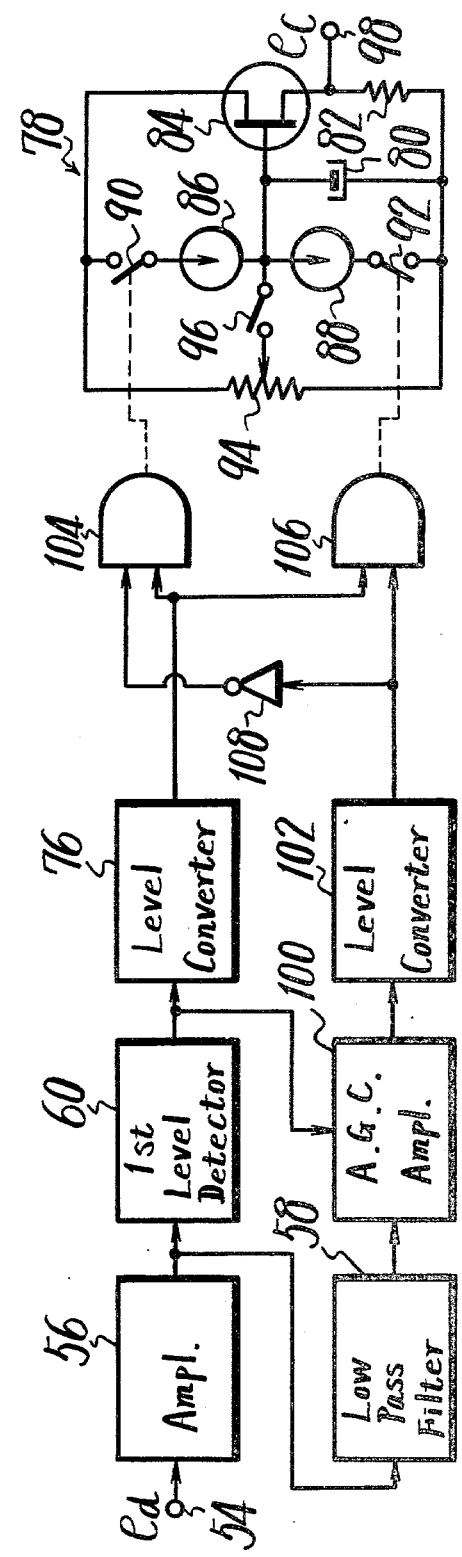

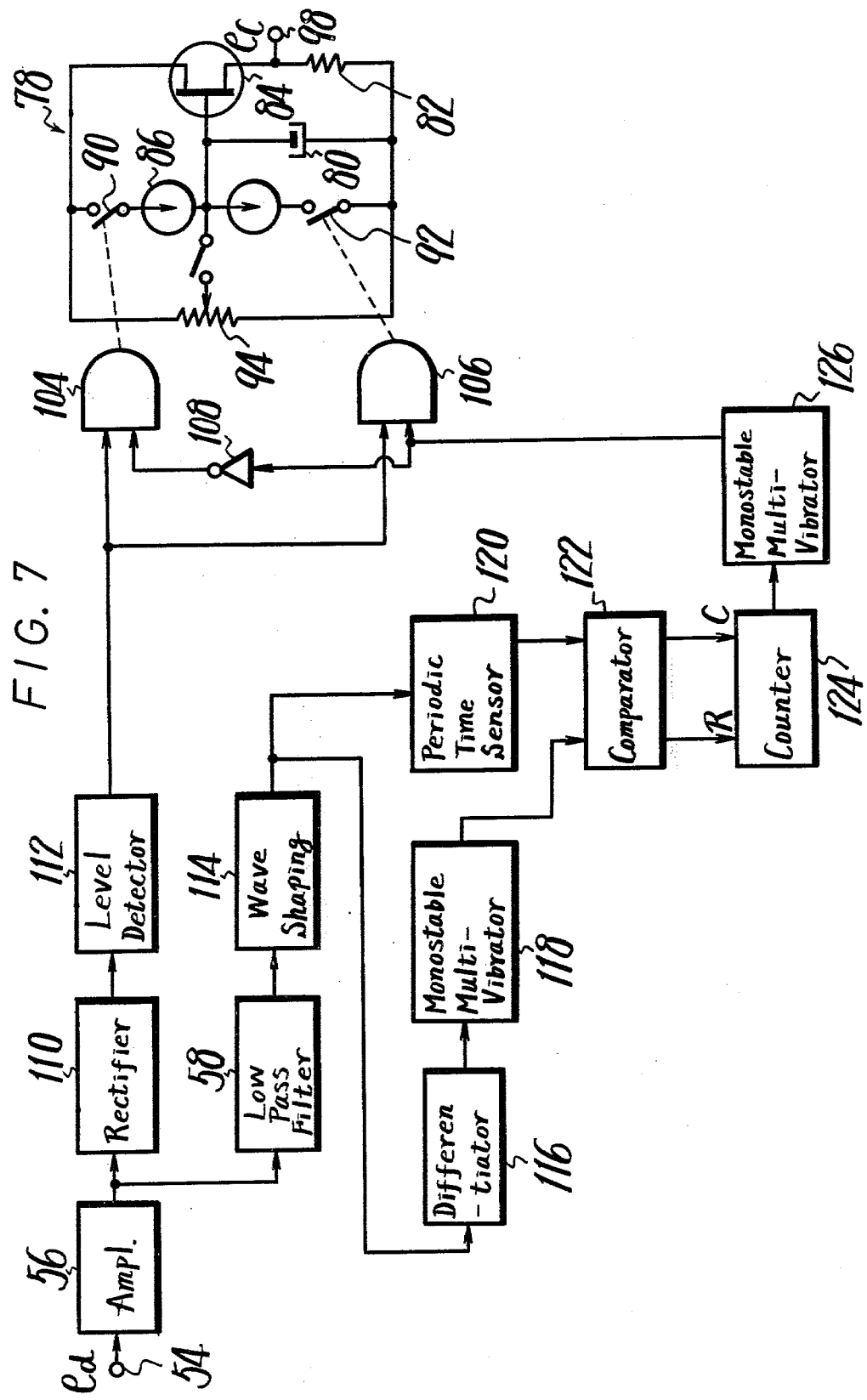

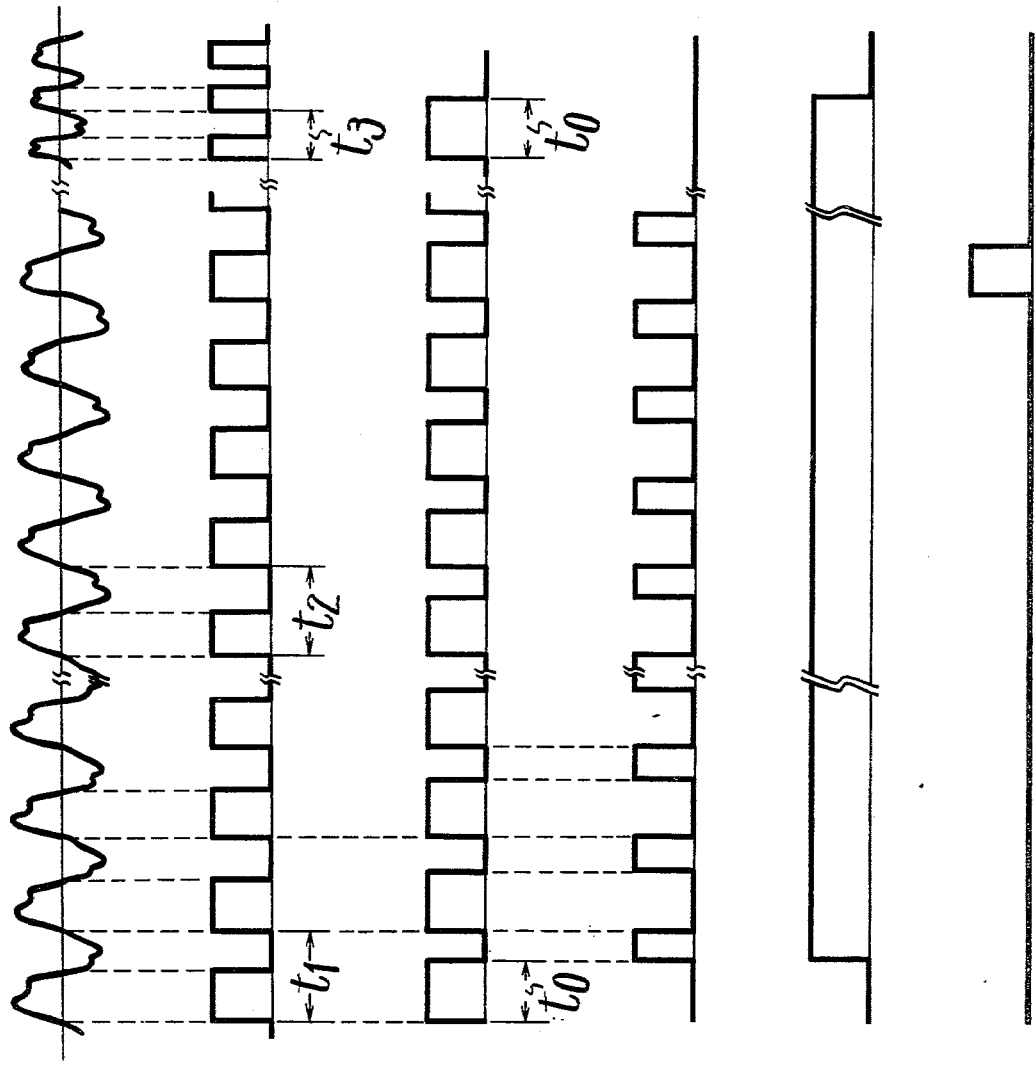

AUTOMATIC FREQUENCY CONTROL SYSTEM FOR SINGLE SIDEBAND SIGNAL RECEIVER

BACKGROUND OF THE INVENTION

1. Field of the Invention

This invention relates generally to single sideband signal receivers, and more particularly is directed to a circuit for automatic frequency control of the carrier frequency demodulator thereof.

2. Description of the Prior Art

As is well-known in the art of single sideband communication, a transmitted single sideband signal does not contain a carrier frequency component. A single sideband signal also lacks any other constant level component by means of which the carrier frequency might be identified or followed by a single sideband receiver. As a result, the tuning of a single sideband receiver has been restricted to manual adjustment of the local or carrier frequency oscillator. However, manual adjustment is troublesome, and in the case of a "drifting" signal, manual tuning adjustment requires constant attention and considerable skill on the part of the operator.

OBJECTS AND SUMMARY OF THE INVENTION

Accordingly, it is an object of the present invention to provide an automatic frequency control circuit for a single sideband receiver which will follow the carrier frequency of the received single sideband signal even when the carrier frequency is constantly changing or "drifting".

It is a further object of the present invention to provide an automatic frequency control circuit which will interfere with existing single sideband receivers.

In accordance with an aspect of this invention, a single sideband receiver having a local oscillator with a controllable oscillation frequency and means responsive to such oscillation frequency for providing an audio or demodulated signal from a received single sideband signal, is provided with an automatic frequency control circuit which comprises low pass filter means for separating a low frequency portion of the demodulated signal, discriminating means for detecting the level of the low frequency portion of the demodulated signal relative to a predetermined level, and circuit means connected between said discriminating means and the local oscillator for controlling said oscillation frequency of the local oscillator in response to the detected relation of the level of said low frequency portion to said predetermined level.

In one embodiment of the invention the discriminating means includes a comparator connected to receive both the demodulated signal and the low frequency portion thereof and discriminate the signal level of the low frequency portion with respect to a predetermined proportion of the demodulated signal level. When the signal level of the low frequency portion of the demodulated signal is too high a proportion of the demodulated signal, the associated circuitry reduces the oscillation frequency of the local oscillation to thereby cause demodulation of the received single sideband signal at a lower carrier frequency. When the signal level of the low frequency portion of the demodulated signal represents too small a proportion of the demodulated signal, the associated circuitry raises the oscillation frequency of the local oscillator to allow demodulation of the received single sideband signal at a higher carrier frequency.

In another embodiment of the present invention, an automatic gain control amplifier acts on the low frequency portion of the demodulated signal and has its gain controlled by the level of the demodulated signal as a whole. When the signal level of the low frequency portion is too small a proportion of the demodulated signal, the gain of the automatic gain control amplifier is decreased for causing the associated circuitry to increase the oscillation frequency of the local oscillator. Similarly when the signal level of the low frequency portion of the demodulated signal represents too high a proportion of the latter, the gain of the automatic gain control amplifier is increased thereby causing the associated circuitry to lower the oscillation frequency of the local oscillator.

In still another embodiment of the present invention, a cycle discriminating circuit is connected to the low pass filter. The cycle discriminating circuit includes a wave shaping circuit which converts the low frequency portion of the demodulated signal into a square-wave signal. A monostable multivibrator is connected to the wave shaping circuit to compare the cycle period of the square-wave signal to a constant time period or reference signal. When the cycle period of the square wave signal is shorter than the constant period of the reference signal, indicating too low a proportion of low frequency components in the demodulated signal, the associated circuitry is controlled to cause the oscillation frequency of the local oscillator to increase. When the cycle period of the square wave is longer than the constant period of the reference signal, indicating too high a proportion of low frequency components in the demodulated signal, the associated circuitry is controlled to cause the oscillation frequency of the local oscillator to decrease.

The above, and other objects, features and advantages of the invention, will be apparent in the following detailed description of illustrative embodiments to be read in connection with the accompanying drawings.

BRIEF DESCRIPTION OF THE DRAWINGS

FIG. 5 is a block diagram of a circuit according to one embodiment of the present invention;

FIG. 6 is a block diagram of a circuit according to another embodiment of the present invention;

FIG. 7 is a block diagram of a circuit according to still another embodiment of the present invention; and FIGS. 8A–8F show a series of wave diagrams to which reference will be made in explaining the operation of the circuit of FIG. 7.

DETAILED DESCRIPTION OF PREFERRED EMBODIMENTS

Figure 1:
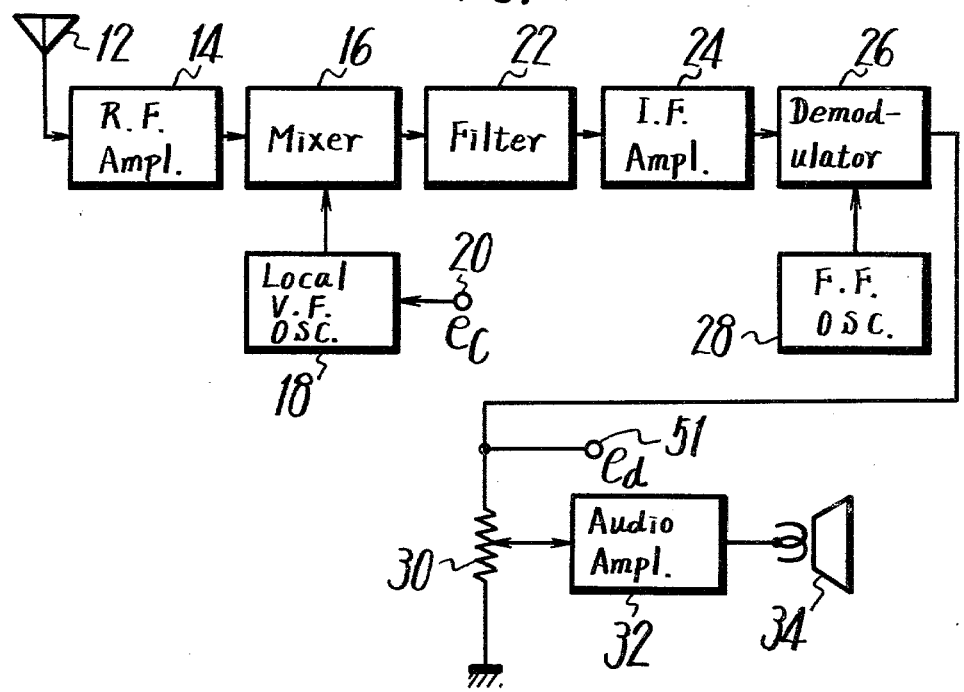
FIG. 1 is a block diagram showing essential components of a conventional single sideband receiver.

FIG. 1 shows the major components of a standard single sideband receiver 10. The receiver 10 has an antenna 12 for receiving broadcast or transmitted signals. A radio frequency or R.F. amplifier 14 is connected to antenna 12 for amplifying all radio signals received within a broad frequency spectrum. A carrier frequency demodulator or mixer 16 is connected to R.F. amplifier 14 for demodulating the signals received with respect to a particular carrier frequency. A variable frequency local oscillator 18 is connected to the carrier frequency demodulator 16 for supplying thereto the selected demodulation frequency. An input terminal 20 of local oscillator 18 receives a control voltage $e_c$ for determining the oscillation frequency thereof. A filter 22 is connected to carrier frequency demodulator or mixer 16 to filter unwanted signals from the intermediate frequency signal generated by demodulator 16. An intermediate frequency or I.F. amplifier 24 is connected to filter 22 to raise the signal level of the filtered intermediate frequency signal. An intermediate frequency demodulator 26 receives the output of amplifier 24 for demodulating an audio or demodulated signal $e_d$ at terminal 51 from the I.F. signal. A fixed frequency oscillator 28 is connected to I.F. demodulator 26 to provide the signal by which the audio signal is demodulated from the I.F. signal. An attenuator 30, amplifier 32 and loud speaker 34 are connected in succession to the output of I.F. demodulator 26 to complete processing of the audio signal. In the receiver 10 of FIG. 1, the audio signal is converted to sound energy as an illustration, however, various other forms of processing circuitry may be connected to the I.F. demodulator 26.

FIGS. 2–4 illustrate the frequency response spectrums of a received single sideband signal and a single sideband received having various carrier frequency relationships. Throughout these figures the horizontal axis represents frequency and the vertical axis represents signal strength, that is, decibels.

Figure 2A:
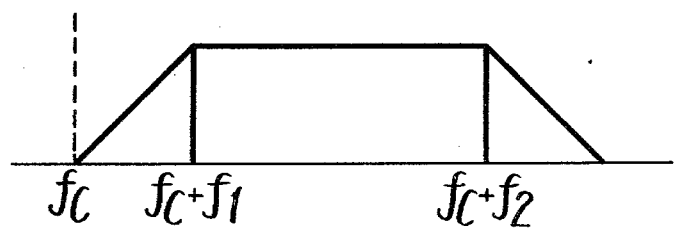
FIGS. 2A–2C; 3A–3C and 4A–4C are signal spectrum diagrams illustrating the relationship between the signal spectrums of a received single sideband signal and a receiver therefor tuned to frequencies which are equal to, less than and greater than, respectively, the carrier frequency of the received signal.
Figure 2B:
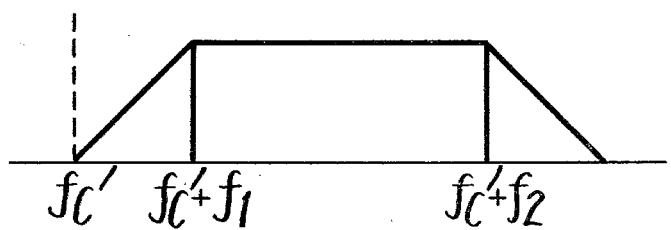

FIG. 2A illustrates the frequency response spectrum of a transmitted or received single sideband signal having the carrier frequency $f_c$. As the carrier frequency is suppressed in single sideband transmissions, no response is shown at the frequency $f_c$. FIG. 2B illustrates the frequency response spectrum of a single sideband receiver tuned to a frequency of $f_c' = f_c$ in order to provide the most accurate demodulation of the received single sideband signal shown in FIG. 2A.

Figure 3A:
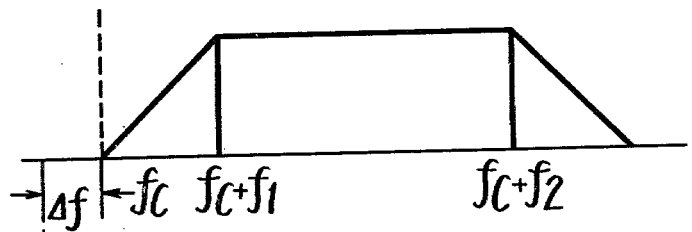
Figure 3B:
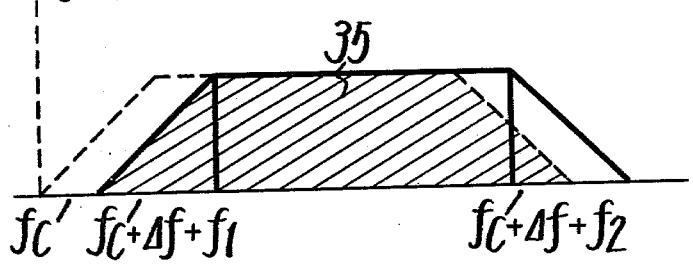

FIGS. 3A and 3B illustrate a frequency difference of $\Delta f$ between the tuned receiver frequency $f_c'$ and the carrier frequency $f_c$. Since the resulting frequency response spectrums of the transmitted or received signal (FIG. 3A) and of the receiver (FIG. 3B) do not coincide, the resulting frequency spectrum which may be demodulated from the illustrated frequency relationship is limited to the shaded or hatched area 35 on FIG. 3B.

Figure 4A:
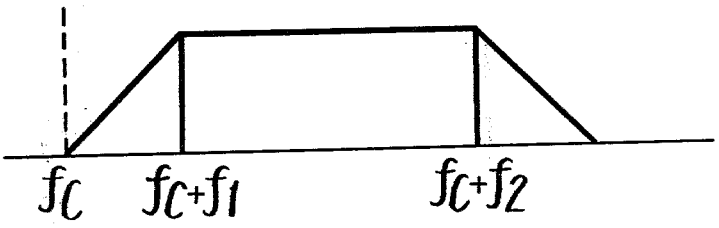
Figure 4B:
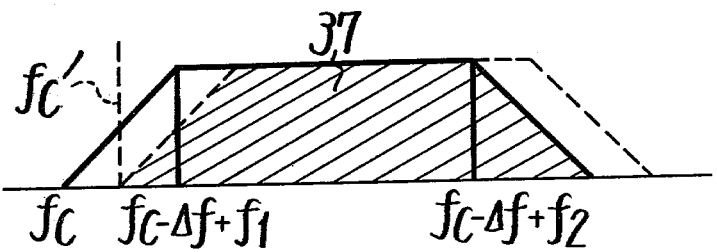

FIGS. 4A and 4B respectively illustrate the frequency response spectrums of the transmitted or received signal having carrier frequency $f_c$ and of the receiver, when the tuned frequency $f_c'$ differs from $f_c$ by $-\Delta f$. As the respective spectrums do not coincide, the portion of the transmitted or received signal which may be effectively demodulated by the receiver is limited to the shaded or hatched area 37 on FIG. 4B.

Figure 2C:
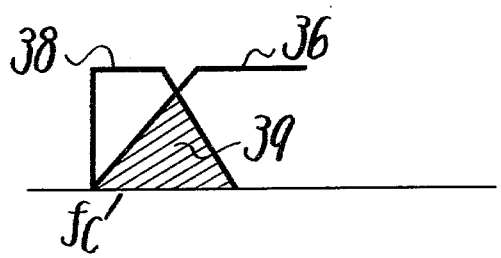
Figure 3C:
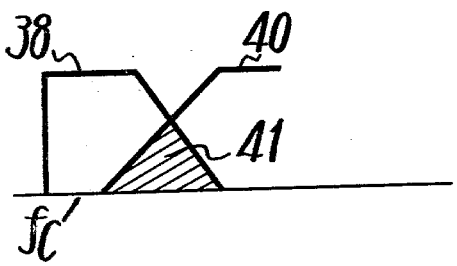
Figure 4C:
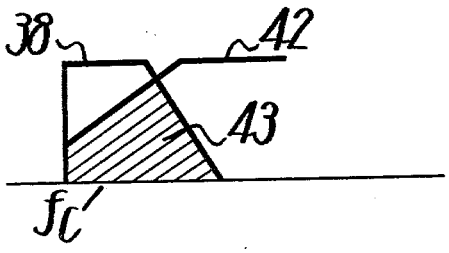

FIG. 2C illustrates the relationship between the frequency response spectrum 36 of an accurately tuned single sideband receiver where $f_c' = f_c$ and the frequency response spectrum 38 of a low pass filter which, for example, has a cut off frequency of approximately 300 Hz. If the low pass filter is connected to the demodulated output of the receiver, only the shaded or hatched portion 39 on FIG. 2C is passed by the filter. FIG. 3C similarly illustrates the relationship between the frequency response spectrum 38 of the low pass filter and the effective frequency response spectrum 40 of a receiver mistuned by $\Delta f$ to receive a signal with carrier frequency $f_c$. The resulting frequency spectrum which will be passed by the low pass filter acting on the demodulated signal is limited to the shaded or hatched area 41 on FIG. 3C. In the same way, FIG. 4C illustrates the relationship between frequency response spectrum 38 of the low pass filter and the effective frequency response spectrum 42 of a receiver mistuned by $-\Delta f$ to receive a single sideband signal having carrier frequency $f_c$. The frequency spectrum which will be passed by the low pass filter receiving the signal from this latter mistuned receiver appears as the shaded or hatched area 43 on FIG. 4C.

Thus, it will be seen from FIGS. 2C, 3C and 4C that the frequency spectrum of a demodulated single sideband signal passed by a low pass filter varies according to the relationship between the receiver frequency and the carrier frequency of the transmitted or received single sideband signal. When the receiver is tuned to a frequency lower than the carrier frequency of the transmitted or received signal, the spectrum (FIG. 3C) which will be passed through a low pass filter is smaller than that (FIG. 2C) which will be passed when the receiver is correctly tuned to the carrier frequency. Conversely, when the receiver is tuned to a frequency higher than the carrier frequency of the transmitted or received single sideband signal, the resulting frequency spectrum passed by a low pass filter (FIG. 4C) is larger than that which would be passed (FIG. 2C) if the receiver were tuned precisely to the carrier frequency.

Consequently, it is possible to determine or discriminate the relationship between the carrier frequency of a transmitted or received single sideband signal and the tuned frequency of a receiver from the signal level of the low frequency portion of the demodulated signal. Based on the foregoing, in accordance with this invention, the level of a low frequency portion of the demodulated signal is discriminated, particularly in relation to the level of a predetermined proportion of the demodulated signal as a whole, and the frequency of the local oscillator is controlled in accordance with discriminated level relation.

FIG. 5 illustrates an automatic frequency control circuit according to one embodiment of the present invention which is intended to be interconnected with the receiver of FIG. 1 to receive a demodulated signal $e_d$ therefrom and to supply a frequency control signal $e_c$ to the variable frequency local oscillator 18. Thus, terminals 54 and 98 on FIG. 5 are to be connected to terminals 51 and 20, respectively, on FIG. 1. The circuit of FIG. 1 may be thought of generally as a means for providing a demodulated signal from a received single sideband signal in response to the oscillation frequency of the variable local oscillator.

The circuitry illustrated in FIG. 5 includes an amplifier 56 connected to the terminal 54 for receiving the demodulated signal $e_d$ from the demodulator 26. A low pass filter 58 is connected to the output of amplifier 56 and has a frequency response spectrum similar to the spectrum 38 shown on FIGS. 2C, 3C and 4C. Level detectors 60 and 62 are connected to the output of amplifier 56 and the output of low pass filter 58, respectively. The level detectors 60 and 62 may be in the form of rectifiers for converting the AC audio signal into an average DC level.

A comparator 64 has inputs connected to the outputs of level detectors 60 and 62, respectively. The comparator 64 determines the relationship between the demodulated signal as a whole and the low frequency portion thereof and generates digital information in response to that determination. AND gates 66 and 68 are provided with three inputs for each AND gate. An output line 70 of comparator 64 is connected directly to an input of each of the AND gates 66 and 68, and an output line 72 of comparator 64 is connected directly to another or second input of AND gate 66. The output line 72 is also connected through an inverter 74 to the second input of AND gate 68. A level converter 76 is connected to level detector 60, and the output of level converter 76 is connected to the third inputs of AND gates 66 and 68.

A voltage control circuit 78 is controllable by the outputs of the AND gates 66 and 68 for providing a voltage $e_c$ to control the oscillation frequency of local oscillator 18 in response to the digital output signals of AND gates 66 and 68. The voltage control circuit 78 is shown to include a capacitor 80, and an output resistor 82 connected across the capacitor 80 through a buffer transistor 84. Controlled current sources 86 and 88 are connected between the buffer transistor 84 and the capacitor 80 and across the capacitor 80, respectively, for charging and discharging, respectively, the capacitor 80. Switch means 90 and 92 are connected in series with controlled current sources 86 and 88, respectively, for controlling the flow of current to and from said capacitor 80. The circuit 78 is also shown to include a potentiometer 94 and switch 96 for enabling manual adjustment of the control voltage $e_c$ produced across resistor 82 and obtained at the terminal 98 which is connected to input terminal 20 of local oscillator 18 for allowing voltage control of the oscillation frequency thereof.

In operation, the circuit of FIG. 5 receives a demodulated signal, $e_d$, via terminal 54 and provides a control voltage, $e_c$, to a receiver as illustrated, for example, in FIG. 1, to control the oscillation frequency of the local oscillator 18 thereof. The amplifier 56 amplifies the demodulated or audio signal, $e_d$ for further use in the circuit. Low pass filter 58 passes only a predetermined frequency spectrum and the demodulated signal. Level detectors 60 and 62 convert the demodulated or audio signal and the filtered demodulated or audio signal, respectively, into DC levels representing the frequency spectra present in the respective signals.

Level converter 76 converts the output of level detector 60 into a digital signal which enables the AND gates 66 and 68 during the presence or existence of a demodulated signal. Thus, when a demodulated signal is not present, the voltage control circuit 78 and the automatic frequency control function are disabled.

The comparator 64 compares the level of the demodulated signal from level detector 60 with the level of the low frequency portion of the demodulated signal from level detector 62 and provides corresponding logic or digital signals at output lines 70 and 72 in response thereto. Thus, for example, the output signal on output line 70 of comparator 64 may indicate a logic "0" when the low frequency portion represents the proper proportion of the demodulated signal. In other words, a logic "0" is indicated when the tuned frequency $f_c'$ of the receiver equals the carrier frequency $f_c$ of the transmitted or received signal. A logic "1" is provided on line 70 when the low frequency portion of the demodulated signal is not the proper proportion, that is, when the tuned receiver frequency $f_c'$ does not equal the carrier frequency $f_c$ of the received signal. Further, a logic "0" appears at output line 72 of comparator 64 when the low frequency portion represents too high a proportion of the demodulated signal, that is, when the tuned receiver frequency $f_c'$ is higher than the carrier frequency $f_c$ of the received signal. Finally, output line 72 provides a logic "1" when the low frequency portion represents too small a proportion of the demodulated signal, that is, when the tuned receiver frequency $f_c'$ is lower than the carrier frequency $f_c$ of the transmitted or received signal.

As a result of the above operations, so long as the output of level converter 76 indicates the presence of a demodulated signal and the receiver is tuned to a frequency $f_c'$ below the carrier frequency $f_c$ of the received signal, all of the inputs of AND gate 66 receive logic "1" and therefore, the output of AND gate 66 is a logic "1". This output from AND gate 66 closes switch 90 causing current from controlled current source 86 to charge capacitor 80. The result is an increase in the voltage $e_c$ at terminal 98 causing the oscillation frequency of the controllable logic oscillator 18 to be raised until that frequency coincides with the actual carrier frequency of the received signal. If the tuned receiver frequency $f_c'$ is greater than the carrier frequency $f_c$ of the received signal, all of the inputs of AND gate 68 are a logic "1" and, therefore, the output of AND gate 68 is a logic "1". Such output from AND gate 68 causes the closing of switch 92 and a flow of current from capacitor 80 through current source 88 to discharge the capacitor 80 and thereby decrease the voltage $e_c$ appearing at terminal 98. As a result of the foregoing, the oscillation frequency of controllable local oscillator 18 is lowered until that frequency coincides with the actual carrier frequency of the received single sideband signal.

FIG. 6 illustrates an automatic frequency control circuit according to another embodiment of the present invention which is also intended to be interconnected with a single sideband receiver as shown, for example, on FIG. 1. Thus, terminal 54 on FIG. 6 is intended to be connected to terminal 51 on FIG. 1 to receive the demodulated signal $e_d$ therefrom, and terminal 98 of FIG. 6 is intended to be connected to terminal 20 of FIG. 1 for supplying the oscillator control voltage $e_c$ thereto. Those components on FIG. 6 which correspond to components described above with reference to FIG. 5 are identified by the same reference numerals and will not be again described in detail. In the automatic frequency control circuit of FIG. 6, an automatic gain control amplifier 100 acts on the output of low pass filter 58 with a gain determined by the output of level detector 60. A level converter 102 is connected to the output of automatic gain control amplifier 100. AND gates 104 and 106 are connected to the outputs of level converters 76 and 102. More particularly, the output of level converter 76 is applied directly to first inputs of AND gate 104 and 106. The output of level converter 102 is applied directly to a second input of AND gate 106 and is also connected, through an inverter 108, to a second input of AND gate 104. The outputs of AND gates 104 and 106 are employed to control switches 90 and 92 of voltage control circuit 78 in the same manner as the AND gates 66 and 68 of FIG. 5.

In operation, the outputs of level detector 60 and low pass filter 58 are received by automatic gain control amplifier 100 which, in effect, provides a comparison of the low frequency portion of the demodulated signal with the level of the demodulated signal as a whole. When the low frequency portion represents too small a proportion of the entire demodulated signal, the output of the automatic gain control amplifier 100 is decreased. When the low frequency portion of the demodulated signal represents too high a proportion of the demodulated signal, the output of the automatic gain control amplifier 100 is increased. Thus, the output of automatic gain control amplifier 100 represents an analog signal proportional to the gain of amplifier 100, and level converter 102 converts this analog signal into either a logic "1" or logic "0" depending upon whether the analog signal is above or below, respectively, a predetermined analog level.

When the tuned receiver frequency $f_c'$ is lower than the carrier frequency $f_c$ of the received signal, the gain of the automatic gain control amplifier 100 is decreased and the output of level converter 102 is a logic "0". Thus, both of the inputs of AND gate 104 receive logic "1" and the output thereof is also logic "1" for closing switch 90 to charge capacitor 80 and thereby raise the oscillation frequency $f_c'$ of the receiver. When the tuned receiver frequency $f_c'$ is higher than the carrier frequency $f_c$ of the received signal, the gain of automatic gain control amplifier 100 is increased and the output of level converter 102 is logic "1". Thus, both inputs of AND gate 106 receive logic "1" and the output thereof is also "1" to close switch 92 and thereby cause a discharge of capacitor 80 and a lowering of the tuned frequency $f_c'$ of the receiver. From the foregoing, it is apparent that the embodiment of FIG. 6 is also capable of controlling automatically the demodulation carrier frequency of a single sideband receiver.

FIG. 7 illustrates still another embodiment of the invention in which components of the automatic frequency control circuit corresponding to those described above with reference to FIG. 5 are identified by the same reference numerals, and further in which the terminals 54 and 98 of the circuit shown on FIG. 7 are intended to be connected to the terminals 51 and 20, respectively, of the single sideband receiver of FIG. 1.

In the circuit of FIG. 7, a rectifier 110 is connected to the output of amplifier 56 and delivers its rectified output to a level converter 112. The output of level converter 112 is connected to one of the inputs of each of the AND gates 104 and 106 for enabling those AND gates and the voltage control circuit 78 in response to the presence of a demodulated audio signal. A wave-shaping circuit 114 is connected to the output of low pass filter 58 and converts the generally sinusoidal low frequency audio signal passed by the low pass filter into a square-wave form. A differentiator 116 is connected to the output of wave-shaping circuit 114 and provides a narrow pulse at the beginning or rising side of each positive pulse in the output of wave shaping circuit 114. A monostable multivibrator 118 is triggered by the narrow pulse output of differentiator 116. The multivibrator 118 has an astable state, triggered by an input pulse from differentiator 116, in which the output of multivibrator 118 changes from its normal logic "0" to a logic "1" for a predetermined time period.

A periodic time sensor 120 is connected to the output of the wave shaping circuit 114, in order to sense the periodic time of the output of the wave shaping circuit 114 at each cycle. A comparator 122 is connected to both the outputs of the monostable multivibrator 118 and the periodic time sensor 120, in order to compare the periodic time of the both outputs, and then the comparator 122 provides two outputs. A counter 124 is connected to the two outputs of the comparator 122 at its set terminal C and reset terminal R, respectively.

A monostable multivibrator 126 is connected to the output of counter 124. When counter 124 counts a predetermined number of pulses it triggers monostable multivibrator 126 to change its output from a logic "0" to a logic "1" for a predetermined time period. The output of multivibrator 126 is applied directly to another input of AND gate 106 and is further applied through an inventor 108 to another input of AND gate 104.

In operation of the circuit shown on FIG. 7, wave shaping circuit 114 converts the generally sinusoidal output of low pass filter 58 into square-wave form. FIG. 8A illustrates a variety of low frequency portions of demodulated signals $e_d$ which may appear at the output of low pass filter 58. The three sections of FIG. 8A represent signals having three different mixtures of low frequency components. The left-hand section of FIG. 8A represents an audio or demodulated signal having a large low-frequency component. The right-hand section of FIG. 8A represents an audio or demodulated signal in which the low-frequency components are of relatively small level. The middle section of FIG. 8A illustrates an audio signal in which the low-frequency components represent an intermediate proportion of the signal somewhere between the proportions of the left and right-hand sections of FIG. 8A.

FIG. 8B illustrates the output of wave-shaping circuit 114 in response to the filter outputs represented by the corresponding sections of FIG. 8A. The result for each section of FIG. 8A is a square or rectangular wave having the same "0" crossing points as the filtered audio signal. The cycle period for each of these sections on FIG. 8B is measured as the time from the beginning of one square or rectangular pulse to the beginning of the next pulse.

FIG. 8C represents the output of monostable multivibrator 118 in response to the square or rectangular wave signals illustrated in FIG. 8B. It will be noted that the astable state of multivibrator 118 has a constant time period $t_0$ regardless of the cycle period of the pulses that trigger the multivibrator.

FIG. 8D illustrates the output of the comparator 122, FIG. 8E illustrates the condition of counter 124, and FIG. 8F illustrates the output of counter 124, respectively.

When the period of the rectangular wave signal (FIG. 8B) from wave-shaping circuit 114, and hence of the pulses from periodic time sensor 120 is longer than the time constant $t_0$ of multivibrator 118, for example, as at $t_1$ and $t_2$ on FIG. 8B, the comparator 122 produces the output FIG. 8D and the output is supplied to the set terminal C of counter 124. However, if the period of the rectangular wave signal from wave-shaping circuit 114, and hence the period or time between two successive pulses from periodic time sensor 120 is shorter than the time constant $t_0$ of multivibrator 118, for example, as at $t_3$ on FIG. 8B, then the comparator 122 produces an output at the other terminal and the output is supplied to the reset terminal R of counter 124. When the pulse with its period $t_3$ shorter than time constant $t_0$ is applied to periodic time sensor 120 from wave shaping circuit 114, comparator 122 does not provide a positive pulse to input C of counter 124.

The counter 124 is designed to provide an output each time a predetermined number of pulses applied to its input C have been counted. In one embodiment of the present invention, this predetermined number of pulses is 8. After counting such number of input pulses, the counter 124 produces an output (FIG. 8F). However, each time a pulse is applied to reset terminal R of counter 124, the latter is reset to zero, that is, the counting up to 8 commences anew.

In the absence of any output pulse from counter 124, that is, when multivibrator 126 is in its stable state, the output of multivibrator 126 appears as logic "0" at an input of AND gate 106 and, through inverter 108, as a logic "1" at an input of AND gate 104. On the occurrence of an output pulse from counter 124, multivibrator 126 is triggered thereby to its astable state to provide logic "1" and logic "0" at the respective inputs of AND gates 106 and 104, respectively. Assuming that level detector 112 is providing an output to AND gates 104 and 106 for enabling the latter in response to the reception of a demodulated or audio signal $e_d$ at terminal 54, then AND gate 104 provides an output to close switch 90 and switch 92 remains open so long as multivibrator 126 remains in its stable state by reason of the absence of any output from counter 124. On the other hand, upon the occurrence of an output pulse from counter 124 and the resultant triggering of multivibrator 126 to its astable state, AND gate 106 provides an output to close switch 92 and switch 90 is open for the duration of the predetermined period during which multivibrator 126 remains in its astable state.

When the tuned receiver frequency $f_c'$ is lower than the carrier frequency $f_c$ of the transmitted or received signal, as on FIG. 3, the low-frequency portion of the demodulated signal present in the output of low pass filter 53 is relatively small, as indicated by the area 41 on FIG. 3C, and this corresponds to the right-hand section of FIG. 8A. Under the foregoing conditions, the period $t_3$ of the rectangular wave signal from wave shaping circuit 114 is smaller than the time constant $t_0$ of multivibrator 118 with the result that comparator 122 provides an output to reset terminal R of counter 124 for resetting the latter and avoiding the provision of an output from counter 124. In the absence of any output from counter 124, multivibrator 126 remains in its stable state so that, with a demodulated signal $e_d$ being applied to terminal 54, AND gates 104 and 106 respectively provide logic "1" and logic "0" for closing and opening switches 90 and 92, respectively. Due to closing of switch 90, capacitor 80 is charged for increasing the level of the control voltage $e_c$ at terminal 98 and thereby increasing the oscillation frequency of the local oscillator 18 on FIG. 1.

In the event that the tuned receiver frequency $f_c'$ is higher than the carrier frequency $f_c$ of the received or transmitted signal, for example, as illustrated on FIG. 4, the output of low pass filter 58 contains a relatively larger portion of the low frequency components of the demodulated signal, for example, as represented by the area 43 on FIG. 4C. The foregoing condition corresponds to the wave forms illustrated at the left-hand and central sections of FIG. 8A and results in the rectangular-wave signal from wave-shaping circuit 114 having a period, as at $t_1$ and $t_2$ on FIG. 8B, larger than the time constant $t_0$ of multivibrator 118 (FIG. 8C). So long as the time period of the rectangular-wave signal from circuit 114 is greater than the time constant $t_0$, each pulse from comparator 122 occurring at the dropping side of each positive pulse from wave-shaping circuit 114 will result in a corresponding output pulse (FIG. 8D) from comparator 122 to the input C of counter 124. When counter 124 has counted a predetermined number of pulses (FIG. 8D), without the occurrence of any reset pulse from comparator 122, counter 124 provides an output pulse (FIG. 8F) to multivibrator 126 by which the latter is triggered to its astable state for a predetermined period of time. During such period of time that multivibrator 126 is in its astable state, each of the inputs of AND gate 106 is a logic "1", with the result that switch 92 is closed for allowing the discharge of capacitor 80. As a result of the foregoing, the control voltage $e_c$ applied to local oscillator 18 on FIG. 1 is decreased for lowering the tuned receiver frequency $f_c'$.

It will be apparent from the foregoing, that the automatic frequency control circuit of FIG. 7 is capable of varying the control voltage $e_c$ applied to the local oscillator 18 of the single sideband receiver shown on FIG. 1 so that the tuned receiver frequency $f_c'$ will automatically follow the carrier frequency $f_c$ of the transmitted single sideband signal, with the tuned receiver frequency $f_c'$ always being within a constant frequency range having the carrier frequency $f_c$ at its center. It has been found that an automatic frequency control circuit according to this invention, for example, as previously described with reference to any one of FIGS. 5, 6 and 7, can be designed to provide a relatively small range of variation of the tuned receiver frequency $f_c'$ relative to the carrier frequency $f_c$ of the transmitted signal, for example, a range of frequency variation of the order of about 50 Hz.

It will be apparent that, due to the provision of the first level detector 60 and level converter 76 in each of FIGS. 5 and 6, and similarly due to the provision of the rectifier 110 and level detector 112 in FIG. 7, the switches 90 and 92 can be selectively closed for varying the tuned receiver frequency $f_c'$ only so long as a demodulated signal $e_d$ is being applied to the input terminal 54. Further, upon manual closing of the switch 96, potentiometer 94 can be manually adjusted for varying the tuned receiver frequency $f_c'$ independently of the automatic action that has been previously described.

Although illustrative embodiments of the invention have been described in detail herein with reference to the accompanying drawings, it is to be understood that the invention is not limited to those precise embodiments, and that various changes and modifications may be effected therein by one skilled in the art without departing from the scope or spirit of the invention as defined in the appended claims.

We claim:

1. In a single sideband receiver having a local oscillator with a controllable oscillation frequency and means responsive to said oscillation frequency for providing a demodulated signal from a received single sideband signal which has its carrier suppressed, an automatic frequency control circuit comprising:

low pass filter means for separating from said demodulated signal a low frequency portion thereof which corresponds to the low frequency end portion of the received signal sideband signal spectrum;

detecting means for detecting the relation of the signal level of said low frequency portion of the demodulated signal in respect to a predetermined signal level which is related to the signal level of said demodulated signal as a whole; and circuit means connected between said detecting means and said local oscillator for varying said oscillation frequency of the local oscillator in response to variation of the detected relation of the signal level of said low frequency portion in respect to said predetermined signal level from a predetermined relation thereof as to maintain said oscillation frequency equal to the frequency of the suppressed carrier of the received single sideband signal.

2. A single sideband receiver according to claim 1; wherein said detecting means includes comparator means for comparing the signal level of said low frequency portion with said signal level of said demodulated signal as a whole, and said predetermined signal level is a predetermined signal proportion of said level of the demodulated signal as a whole.

3. A single sideband receiver according to claim 2; wherein said circuit means includes means for raising the oscillation frequency of said local oscillator when said low frequency portion signal level is less than said predetermined proportion of said demodulated signal level, and means for lowering the oscillation frequency of said local oscillator when said low frequency portion signal level is greater than said predetermined proportion of said demodulated signal level.

4. A single sideband receiver according to claim 2; wherein said detecting means further includes first and second level detector means, said first level detector means receiving said demodulated signal for measuring the signal level of the latter and providing a corresponding signal level indication to said comparator means, and said second level detector means being connected between said low pass filter means and said comparator means for indicating to the latter the signal level of said low frequency portion of said demodulated signal.

5. A single sideband receiver according to claim 1; wherein said means for providing the demodulated signal includes a mixer for mixing the received single sideband signal with the output of said local oscillator to convert the received signal to an intermediate frequency signal, and a demodulator for demodulating said intermediate frequency signal and thereby providing said demodulated signal in the form of an audio signal.

6. A single sideband receiver according to claim 5; further comprising signal detector means connected to said demodulator for detecting the existence of said audio signal, and means responsive to said signal detector means for disabling said circuit means in the absence of a detected audio signal.

7. A single sideband receiver according to claim 1; wherein said local oscillator is adapted to have its oscillation frequency controlled by a control voltage applied thereto, and said circuit means includes means responsive to said detected relation for providing a control voltage to said local oscillator for varying said oscillation frequency thereof in the sense to maintain an optimum value of said signal level of the low frequency portion.

8. A single sideband receiver according to claim 7; wherein said means for providing the control voltage includes a capacitor, means for causing the voltage across said capacitor to control the oscillation frequency of said local oscillator and controlled current source means for charging and discharging said capacitor and thereby controlling the voltage thereacross; and wherein said circuit means further includes logic means connected between said discriminating means and said current source means for controlling said current source means in response to the output of said discriminating means.

9. In a single sideband receiver having a local oscillator with a controllable oscillation frequency and means responsive to said oscillation frequency for providing a demodulated signal from a received single sideband signal, an automatic frequency control circuit comprising: low pass filter means for separating a low frequency portion of said demodulated signal; discriminating means for detecting the level of said low frequency portion of the demodulated signal relative to a predetermined level; circuit means connected between said discriminating means and said local oscillator for controlling said oscillation frequency of the local oscillator in response to the detected relation of the level of said low frequency portion to said predetermined level; said discriminating means including wave shaping means connected to said low pass filter means for converting the output thereof into a square-wave form, differentiating circuit means connected to said wave shaping means to generate a pulse at the beginning of each cycle of said square-wave, monostable multivibrator means connected to said differentiating circuit means and having a non-stable state with a predetermined time period, periodic time sensing means for sensing the time period of said square-wave, periodic time comparator means for comparing the period of the output of said monostable multivibrator means and the period of the output of said period time sensing means, pulse counter means, means connected to said comparator means for supplying a first output signal to said pulse counter means when the cycle period of the square-wave from said periodic time sensing means is greater than said predetermined time period of said multivibrator means in correspondence to a low-frequency portion having a level greater than said predetermined level, and means connected to said comparator means for supplying a second output signal to said pulse counter means when the cycle period of the square-wave from said wave shaping means is less than said predetermined time period of said multivibrator means in correspondence to a level of the low-frequency portion which is less than said predetermined level.

10. A single sideband receiver according to claim 1; wherein said detecting means includes automatic gain control amplifier means having its gain controlled by the signal level of said demodulated signal as a whole and being connected to said low pass filter means for receiving said low frequency portion of said demodulated signal, said detecting means having level converter means for comparing a signal level of an output of said gain control amplifier and said predetermined signal level, said circuit means being responsive to the result of the comparsion.

11. A single sideband receiver according to claim 10; wherein said circuit means includes means for raising the oscillation frequency of said local oscillator when said low frequency portion signal level is less than a predetermined proportion of said demodulated signal level and said automatic gain control amplifier means indicates this relationship via a decrease in the gain thereof, and means for lowering the oscillation frequency of said local oscillator when said low frequency portion signal level is greater than a predetermined proportion of said demodulated signal level and said automatic gain control amplifier means indicates this relationship via an increase in the gain thereof.

12. A single sideband receiver according to claim 11; wherein said circuit means includes means for converting an output from said automatic gain control amplifier means representing the gain of said amplifier means, from an analog signal to digital form.

* * * * *